United States Patent
Igarashi et al.

(10) Patent No.: US 11,049,736 B2
(45) Date of Patent: Jun. 29, 2021

(54) CIRCULATING EFEM

(71) Applicant: TDK CORPORATION, Tokyo (JP)

(72) Inventors: Hiroshi Igarashi, Tokyo (JP); Tsutomu Okabe, Tokyo (JP); Mutsuo Sasaki, Tokyo (JP)

(73) Assignee: TDK CORPORATION, Tokyo (JP)

(*) Notice: Subject to any disclaimer, the term of this patent is extended or adjusted under 35 U.S.C. 154(b) by 0 days.

(21) Appl. No.: 16/395,406

(22) Filed: Apr. 26, 2019

(65) Prior Publication Data

US 2019/0341273 A1 Nov. 7, 2019

(30) Foreign Application Priority Data

May 2, 2018 (JP) .............................. JP2018-088730

(51) Int. Cl.
*H01L 21/67* (2006.01)
*H01L 21/677* (2006.01)

(52) U.S. Cl.
CPC .. *H01L 21/67017* (2013.01); *H01L 21/67742* (2013.01)

(58) Field of Classification Search
CPC ......... H01L 21/67017; H01L 21/67069; H01L 21/67742; B01F 3/026; B01F 5/0413
USPC ................................................ 141/8, 65, 98
See application file for complete search history.

(56) References Cited

U.S. PATENT DOCUMENTS

| 2,909,983 | A | * | 10/1959 | Scheck | F24F 13/12 454/324 |
| 3,594,922 | A | * | 7/1971 | Ellis | G09B 23/12 434/72 |
| 4,693,175 | A | * | 9/1987 | Hashimoto | F24F 3/161 454/187 |
| 8,500,382 | B2 | * | 8/2013 | Castantini | F24F 3/1607 118/715 |
| 8,522,836 | B2 | * | 9/2013 | Okabe | H01L 21/67393 141/286 |
| 9,175,873 | B2 | * | 11/2015 | Sheldon | F24F 13/1426 |
| 9,845,969 | B2 | * | 12/2017 | Ali | F24F 13/14 |
| 10,170,349 | B2 | * | 1/2019 | Maeda | G03F 7/162 |
| 2004/0168742 | A1 | * | 9/2004 | Kim | H01L 21/67017 141/98 |
| 2008/0160905 | A1 | * | 7/2008 | Kim | F24F 11/72 454/340 |
| 2009/0186569 | A1 | * | 7/2009 | Miura | H01L 21/67288 454/66 |
| 2011/0097990 | A1 | * | 4/2011 | Charron | F24F 13/14 454/367 |

(Continued)

FOREIGN PATENT DOCUMENTS

| JP | 2015-146349 A | | 8/2015 | |
| JP | 2017050517 A | * | 3/2017 | ....... H01L 21/67393 |

*Primary Examiner* — Timothy L Maust
(74) *Attorney, Agent, or Firm* — Oliff PLC

(57) ABSTRACT

A circulating EFEM includes an introduction port for introducing a gas, a housing for circulating the introduced gas, and a discharge port for discharging the gas from the housing into a discharge pipe. The discharge port includes a box and a damper. The box is disposed to surround a discharge opening formed on the housing and connected to the discharge pipe. The damper is disposed inside the box to close and open the discharge port and adjusts a discharge amount of the gas via the discharge opening by at least partially moving in response to a differential pressure between the housing and the box.

9 Claims, 5 Drawing Sheets

(56) References Cited

U.S. PATENT DOCUMENTS

| | | | |
|---|---|---|---|
| 2015/0170945 A1* | 6/2015 | Segawa | H01L 21/67017 414/217 |
| 2016/0020122 A1* | 1/2016 | Watanabe | H01L 21/67051 156/345.15 |
| 2016/0091216 A1* | 3/2016 | Tran | F24F 11/0001 236/49.3 |
| 2017/0136489 A1* | 5/2017 | Maeda | H01L 21/6719 |
| 2017/0328413 A1* | 11/2017 | Bamberger | F24F 13/1486 |
| 2018/0040493 A1* | 2/2018 | Kawai | H01L 21/68707 |
| 2018/0254209 A1* | 9/2018 | Kawai | H01L 21/67393 |
| 2019/0013227 A1* | 1/2019 | Okabe | H01L 21/67763 |
| 2019/0049845 A1* | 2/2019 | Yoshimura | G03F 7/162 |
| 2019/0195520 A1* | 6/2019 | King, Jr. | F24F 7/02 |

\* cited by examiner

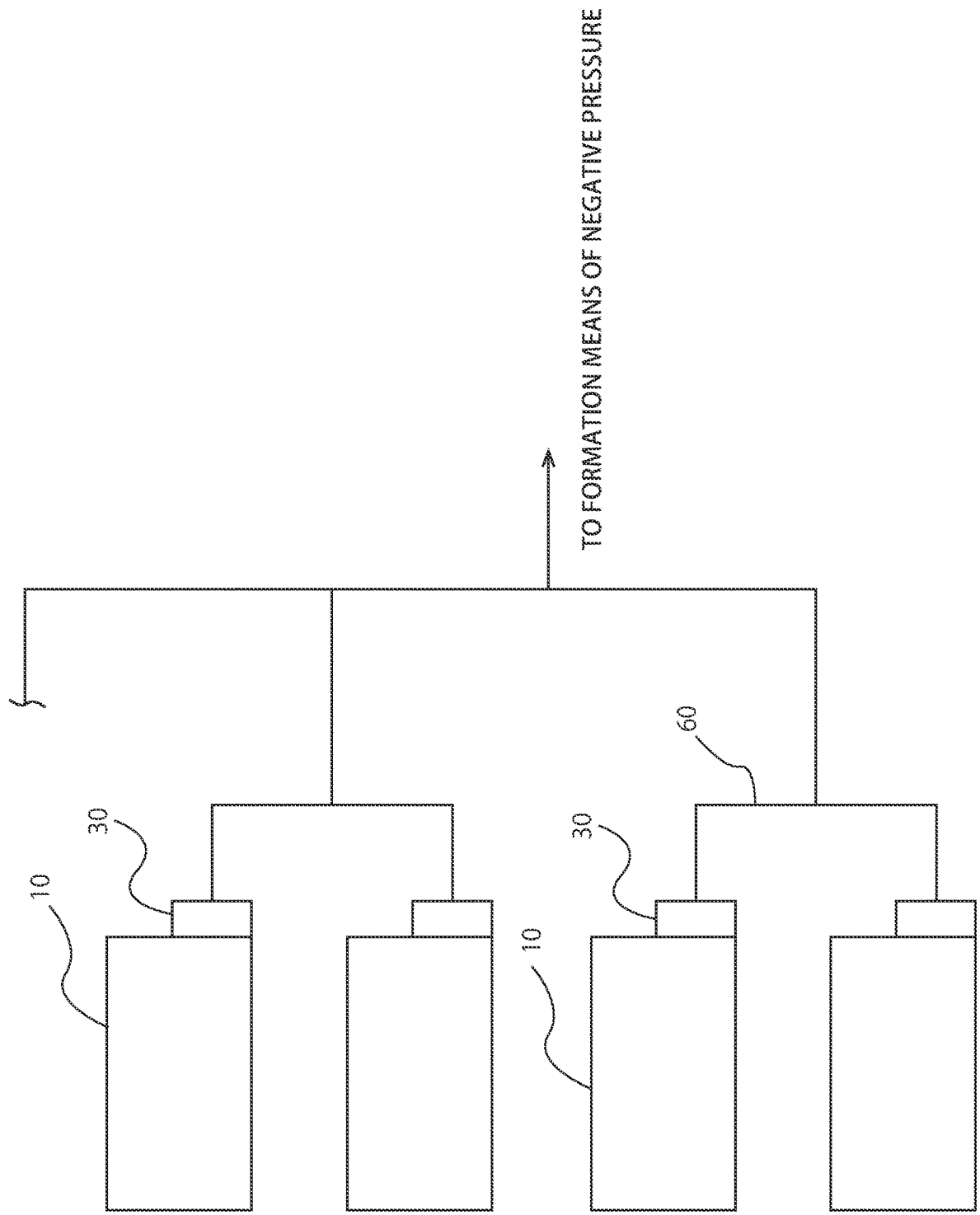

CIRCULATING EFEM

BACKGROUND OF THE INVENTION

The present invention relates to a circulating EFEM where a gas, such as nitrogen, circulates in a housing.

In a manufacturing process of semiconductors, wafers are transported using an apparatus referred to as an equipment front end module (EFEM). In a factory, the wafers are transported using a container referred to as a front-opening unified pod (FOUP) or so. The EFEM is used for transporting the wafers in the container into processing apparatuses and returning the wafers subjected to a predetermined processing in the processing apparatuses into the container. The EFEM is provided with an installation stand for a container referred to as a load port apparatus, a housing for producing a wafer transportation space for transporting the wafers, a transportation robot for transporting the wafers, and the like.

To prevent attachment of hazardous substances and particles to the wafers to be transported, oxidation of the wafers, and the like, a clean atmosphere is preferably maintained in a wafer transportation chamber formed in the EFEM. For example, the wafer transportation chamber may be filled with a clean air (a purified air), but for prevention of oxygen or so from contacting with the wafers, the wafer transportation chamber is preferably filled with an inert gas, such as nitrogen. Thus, circulating EFEMs are proposed. The circulating EFEMs introduce an inert gas, such as nitrogen, into the wafer transportation chamber and circulate the gas in the apparatus so as to maintain an inert atmosphere in the wafer transportation chamber.

Patent Document 1: JP2015146349 (A)

BRIEF SUMMARY OF INVENTION

The circulating EFEMs are provided with a discharge port for discharging a gas, such as nitrogen, from the inside of the EFEMs, but it is difficult for conventional circulating EFEMs to adjust a discharge amount of gas discharged from the discharge port. For example, a gas supply amount into the EFEMs may be desired to change based on a cleanliness of the wafer transportation chamber or so. In the conventional EFEMs, however, the gas discharge amount cannot appropriately be adjusted, and a pressure of the wafer transportation chamber may thereby excessively change at the time of changing the gas supply amount. In the conventional EFEMs, since the gas discharge amount cannot appropriately be adjusted, similar problems may arise when a pressure of a discharge pipe changes.

The present invention has been achieved under such circumstances. It is an object of the invention to provide a circulating EFEM capable of favorably adjusting a discharge amount of gas from a housing into a discharge pipe.

To achieve the above object, a circulating EFEM according to the present invention includes:

an introduction port for introducing a gas;
a housing for circulating the introduced gas; and
a discharge port for discharging the gas from the housing into a discharge pipe, wherein the discharge port includes:
a box disposed to surround a discharge opening formed on the housing and connected to the discharge pipe; and
a damper disposed inside the box to close and open the discharge port and configured to adjust a discharge amount of the gas via the discharge opening by at least partially moving in response to a differential pressure between the housing and the box.

The circulating EFEM according to the present invention includes the damper configured to adjust a discharge amount of the gas via the discharge opening by moving in response to the differential pressure and can thereby favorably maintain a pressure of the housing and a discharge amount of the gas even if an introduction amount of the gas from the introduction port changes. For example, when a large amount of the gas is introduced from the introduction port, the damper disposed on the EFEM can prevent the pressure in the housing from excessively increasing by widely opening the discharge opening and increasing a discharge amount of the gas. On the other hand, when a small amount of the gas is introduced from the introduction port, the damper disposed on the EFEM can prevent the pressure in the housing from excessively decreasing by slightly opening or closing the discharge opening and reducing a discharge amount of the gas. Since the damper automatically adjusts the discharge amount based on changes in gas introduction amount, the EFEM according to the present invention can reduce a gas consumption by reducing the gas amount when the transportation chamber has a high cleanliness.

For example, the damper may include an adjustment mechanism for changing a correlation between a discharge amount of the gas and the differential pressure.

The circulating EFEM including the adjustment mechanism can appropriately adjust operation conditions of the damper based on conditions of the circulating EFEM or equipment connected thereto, such as a negative pressure of the discharge pipe connected to the box and a state of a circulating airflow in the circulating EFEM. Thus, this circulating EFEM can be used with favorable conditions while being connected to various apparatuses in various factories.

For example, the box may be provided with an outside-air introduction opening for introducing an outside air of the housing into the box.

In this EFEM, for example, even if a negative pressure of the discharge pipe changes, the amount of the outside air introduced from the outside-air introduction opening into the box changes, and the pressure of the box can thereby be prevented from excessively changing. Thus, even if the negative pressure of the discharge pipe connected to the box changes, the circulating EFEM including the discharge pipe can prevent the gas of the housing from excessively being discharged and reduce a consumption of the gas.

For example, the outside-air introduction opening may be a clearance formed between the box and a lateral wall of the housing with the discharge opening.

In the discharge port including this outside-air introduction opening, an airflow going toward the discharge pipe is produced around the discharge opening in the box, and the gas discharged from the discharge opening thereby follows the airflow going toward the discharge pipe and appropriately flows toward the discharge pipe. Thus, this discharge port can prevent a problem of gas leakage to the outside except for the discharge pipe.

For example, the damper may include: a bottomless cylindrical enclosure portion substantially perpendicularly protruding from a lateral wall of the housing with the discharge opening and enclosing an outer circumference of the discharge opening; and a movable plate configured to close and open the discharge opening enclosed by the enclosure portion by moving so as to contact with and separating from a tip periphery of the enclosure portion.

This damper generates a force that moves the movable plate by the differential pressure itself. Thus, this damper has a simple structure and is durable and excellent in maintenance property.

For example, the damper may include a shaft disposed in substantially parallel to the lateral wall of the housing above the enclosure portion, and the movable plate may rotate around the shaft.

This movable plate closes the discharge opening by gravity and thereby has a simpler structure and is durable. When a weight or so is attached on this movable plate, movement conditions of this movable plate can easily be changed.

For example, the tip periphery of the enclosure portion may be inclined against the lateral wall of the housing.

When the tip periphery of the enclosure portion is inclined against the perpendicular lateral wall, the movable plate securely moves to a closure position by gravity and can close the discharge opening at a small differential pressure between the housing and the box.

For example, the discharge opening may be formed below the introduction port of the housing.

When the discharge opening is formed below the introduction port, particles and contaminants in the housing can effectively be discharged together with the gas.

BRIEF DESCRIPTION OF DRAWINGS

FIG. 5 is a conceptual view illustrating discharge pipes connected to a box of the discharge port.

DETAILED DESCRIPTION OF INVENTION

Hereinafter, the present invention is described based on an embodiment shown in the figures.

Figure 1:
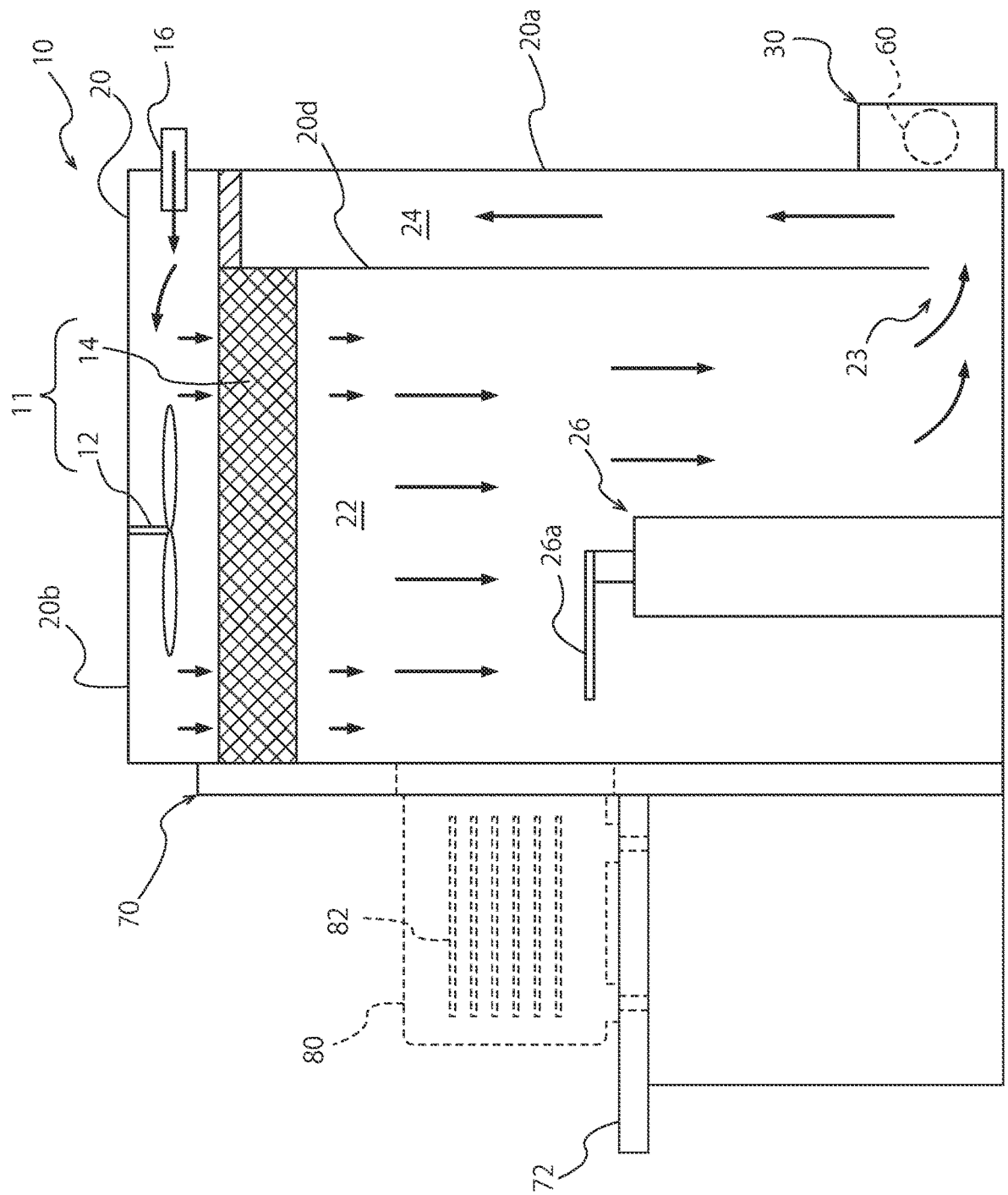
FIG. 1 is a schematic view of an EFEM according to an embodiment of the present invention.

FIG. 1 is a schematic perspective view of an equipment front end module (EFEM) 10 according to an embodiment of the present invention. For example, the EFEM 10 is disposed with various processing apparatuses (not illustrated) in a semiconductor factory and includes a transportation section for transporting wafers 82 contained in a front-opening unified pod (FOUP) 80 as a transportation container into the processing apparatuses and a housing 20 for forming a clean space where the wafers 82 during transportation pass between the FOUP 80 and the processing apparatuses.

The EFEM 10 is a circulating EFEM including an introduction port 16, the housing 20, and a discharge port 30. The introduction port 16 introduces a gas into the housing 20. The introduced gas circulates in the housing 20. The discharge port 30 discharges the gas from the housing 20 into a discharge pipe 60. The gas introduced from the introduction port 16 into the housing 20 is a nitrogen gas, other inert gas, or the like and is preferably a nitrogen gas, though not limited.

The EFEM 10 is used while the housing 20 is having a gas atmosphere by replacing the air in the housing 20 with the gas introduced from the introduction port 16, but the housing 20 has any gas concentration. The gases filling the housing 20 may include air and gas other than the gas introduced from the introduction port 16 of the housing 20 within an allowable limit.

In addition to the introduction port 16, the housing 20, and the discharge port 30, the EFEM 10 includes a load port apparatus 70, a fan filter unit 11, and a wafer transportation robot 26. The load port apparatus 70 includes an installation stand 72 for installing the FOUP 80, a door (not illustrated) for opening a lid of the FOUP 80, and the like. The fan filter unit 11 produces a circulating airflow in the housing 20 and removes toxic substances, particles, and the like. The wafer transportation robot 26 is a transportation section for transporting the wafers 82.

The load port apparatus 70 is disposed to block a lateral wall of the housing 20. The load port apparatus 70 can airtightly connect the FOUP 80 installed on the installation stand 72 with the housing 20 by moving the FOUP 80 in the horizontal direction. Moreover, the load port apparatus 70 can connect the inside of the FOUP 80 containing the wafers 82 and a wafer transportation chamber 22 formed in the housing 20 by opening the lid of the FOUP 80.

The wafer transportation robot 26 is placed on the floor of the wafer transportation chamber 22 of the housing 20 and includes an arm 26a for holding and transporting the wafers 82. The wafer transportation robot 26 transports the wafers 82 in the FOUP 80 into the processing apparatuses attached to the EFEM 10 (for more detail, a load lock chamber of the processing apparatuses or so, for example) and transports the wafers 82 processed in the processing apparatuses into the FOUP 80 therefrom.

The fan filter unit 11 is disposed around a ceiling 20b of the housing 20. The fan filter unit 11 includes a fan 12 disposed on the ceiling 20b of the housing 20 and a filter 14 disposed under the fan 12. The fan 12 produces a downflow in the wafer transportation chamber 22 located below the filter 14. For example, the fan 12 includes blades inclined against a rotating direction and a motor for rotating the blades, but may be any fan that produces a predetermined airflow in the housing 20.

The filter 14 is disposed under the fan 12. The filter 14 is not limited and can be, for example, one obtained by combining a particle removal filter with a chemical filter. The filter 14 can remove particles and contaminants existing in the gases filled in the housing 20. Incidentally, the fan filter unit 11 should include at least the filter 14 and a ventilator section, such as the fan 12, and includes a filter and a ventilator section that are separately arranged.

The housing 20 has an outer shape of substantially rectangular-parallelepiped. The wafer transportation chamber 22 and a circulation channel 24 are formed in the housing 20. An intermediate wall 20d separating the wafer transportation chamber 22 from the circulation channel 24 is disposed in the housing 20. The circulation channel 24 is formed between the intermediate wall 20d and an upright lateral wall 20a of the housing 20 and between the filter 14 and the ceiling 20b of the housing 20.

The intermediate wall 20d blocks an airflow by gas or so, but a circulation clearance 23 is formed between the intermediate wall 20d and the floor. Thus, the wafer transportation chamber 22 and the circulation channel 24 are connected via the filter 14 in the upper part of the wafer transportation chamber 22 and are connected via the circulation clearance 23 in the lower part of the wafer transportation chamber 22.

To pass an airflow formed by the fan 12 through the filter 14 disposed on a ceiling of the wafer transportation chamber 22, a downflow (an airflow going downward) by the fan 12 disposed on the ceiling is formed in the wafer transportation chamber 22. A gas flows from the wafer transportation chamber 22 into the circulation channel 24 via the circulation clearance 23 formed between the intermediate wall 20d and the floor, and an upward airflow going from the circulation clearance 23 toward the fan 12 is formed in a major part of the circulation channel 24 other than above the filter 14. Accordingly, the gas introduced from the introduction port 16 circulates in the housing 20.

Incidentally, the circulation channel 24 may be provided with a filter differing from the filter 14 disposed in the wafer transportation chamber 22 and may be provided with a fan that generates an upward airflow in the circulation channel 24 in addition to the fan 12 disposed on the ceiling 20b of the housing 20.

The introduction port 16 is disposed in the circulation channel 24 near the ceiling 20b of the housing 20. The introduction port 16 includes a gas discharge nozzle for discharging an inert gas, such as nitrogen, and introduces a gas into the housing 20. The introduction port 16 is supplied with a gas from a gas tank (not illustrated). The introduction port 16 shown in FIG. 1 discharges a gas toward the fan 12 in the circulation channel 24, but the introduction port 16 contained in the EFEM 10 is not limited thereto. For example, the introduction port 16 may be disposed in the wafer transportation chamber 22 with a gas discharge nozzle located under the filter 14.

The discharge port 30 is disposed outside the housing 20 and is attached to the lateral wall 20a near the floor. FIG. 2A is a schematic cross-sectional view of the discharge port 30. The discharge port 30 includes a box 32 and a damper 40 disposed inside the box 32.

As shown in FIG. 2A, the box 32 has an outer shape of substantially rectangular-parallelepiped whose one of surfaces is open and is attached to the lateral wall 20a so that an opening periphery 33 faces the lateral wall 20a of the housing 20. The box 32 is disposed to cover a circumference of a discharge opening 20aa formed on the lateral wall 20a of the housing 20. The opening periphery 33 of the box 32 faces the lateral wall 20a around the discharge opening 20aa.

Incidentally, the discharge opening 20aa is a part of the lateral wall 20a that functions as a flow channel wall of the circulation channel 24 shown in FIG. 1, and a lower end of the intermediate wall 20d is formed to overlap with the discharge opening 20aa or the opening periphery 33 of the box 32 when viewed from the horizontal direction, but this is not the only one position of the discharge opening 20aa. In view of increasing the cleanliness of the wafer transportation chamber 22, the discharge opening 20aa is formed below the introduction port 16 shown in FIG. 1 in the housing 20, but this is not the only one positional relation between the introduction port 16 and the discharge opening 20aa.

Figure 4:
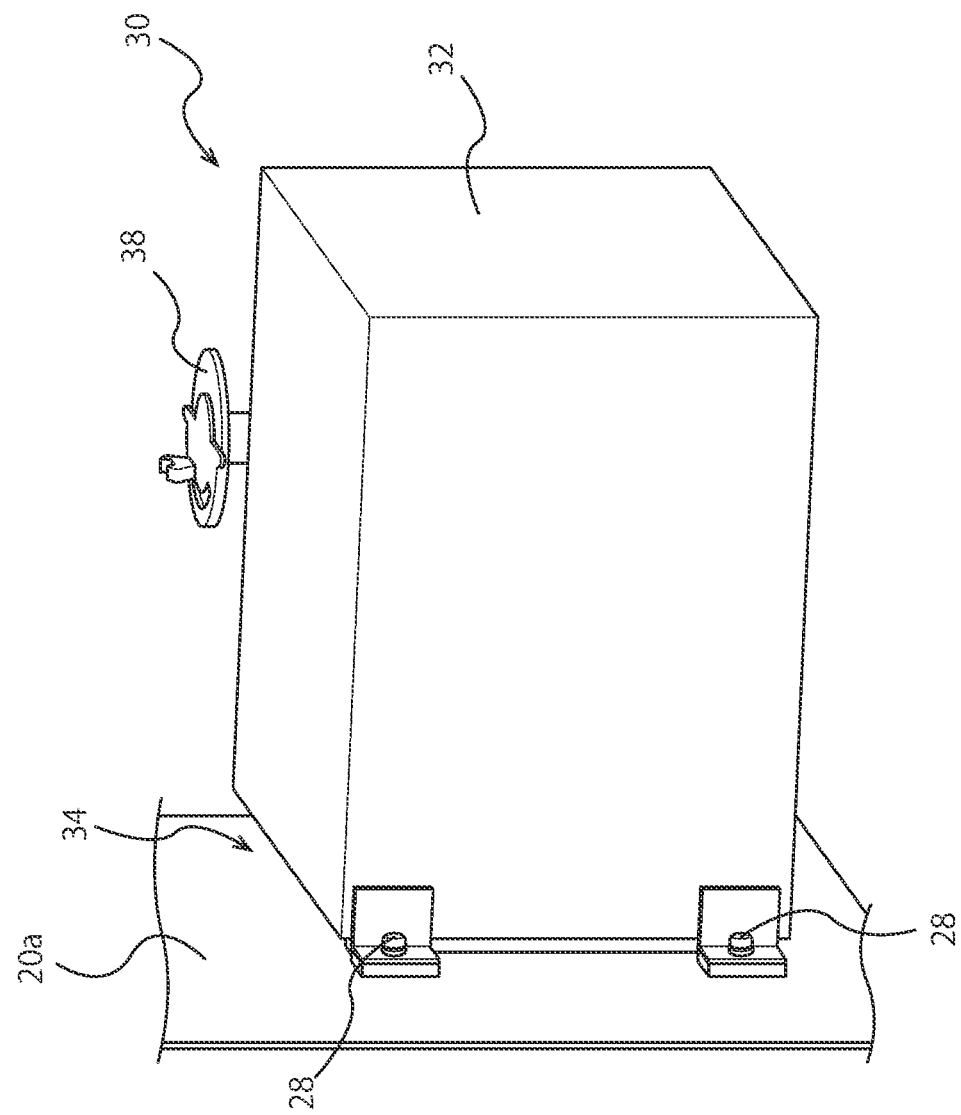
FIG. 4 is an exterior view of the discharge port in the EFEM shown in FIG. 1.

As shown in the exterior view (FIG. 4), the box 32 is fixed to the lateral wall 20a using bolts 28 or so, but this is not the only one method for fixing the box 32. Moreover, as shown in FIG. 2A and FIG. 4, clearances 34 (outside-air introduction openings) for introducing the outside air of the housing 20 into the box 32 are formed between the lateral wall 20a and the opening periphery 33 of the box 32. Since the discharge pipe 60 is connected into the box 32, the outside air (atmospheric air) is introduced into the box 32 via the clearances 34 when the box 32 has a negative pressure.

As shown in FIG. 2A, the box 32 is provided with a box opening 36 formed on a surface of the box 32 differing from the surface facing the lateral wall 20a. The discharge pipe 60 for discharging a gas is connected to the box 32 and can be communicated therewith via the box opening 36. The box opening 36 is provided with a connection valve 38 capable of opening and closing the box opening 36. An operator of the EFEM 10 can operate the connection valve 38 by turning a valve operation handle 39 disposed above the box 32. Incidentally, the connection valve 38 is normally opened during use of the EFEM 10.

FIG. 5 is a conceptual view illustrating the discharge pipe 60. The discharge pipe 60 is connected to a plurality of discharge ports, such as the discharge ports 30 of the multiple EFEMs 10 and discharge ports of other apparatuses (e.g., processing apparatuses) excluding the EFEM 10 provided in the factory. The discharge pipe 60 is connected to discharge sections, such as pump, and preferably has a negative pressure.

As shown in FIG. 2A, the damper 40, which can close and open the discharge opening 20aa, is disposed inside the box 32. The damper 40 controls a discharge amount of gas from the discharge opening 20aa by moving a movable plate 44 in response to a differential pressure between the box 32 and the housing 20 (particularly, the circulation channel 24 near the discharge opening 20aa (see FIG. 1)).

As shown in FIG. 2A and FIG. 2B, the damper 40 includes an enclosure portion 42, the movable plate 44, and a shaft 46. The enclosure portion 42 has a bottomless cylindrical outer shape protruding substantially perpendicularly from the lateral wall 20a of the housing 20 with the discharge opening 20aa and enclosing an outer circumference of the discharge opening 20aa. A base periphery and a tip periphery 42a of the enclosure portion 42 have a flange shape protruding outward from the cylindrical portion, and the base periphery of the enclosure portion 42 is fixed to the lateral wall 20a.

The movable plate 44 rotates around the shaft 46 disposed in substantially parallel to the lateral wall 20a above the enclosure portion 42. The movable plate 44 is connected to the box 32 (fixed part) via a hinge mechanism, but this is not the only one method for attaching the movable plate 44. The movable plate 44 has an area that is larger than an opening area of the tip periphery 42a of the enclosure portion 42. The movable plate 44 contacts with and separates from the tip periphery 42a of the enclosure portion 42 in response to a differential pressure between a pressure from a surface of the movable plate 44 facing the discharge opening 20aa and a pressure from the opposite surface and thereby closes and opens the discharge opening 20aa enclosed by the enclosure portion 42.

FIG. 2A and FIG. 2B show that the movable plate 44 is in contact with the tip periphery 42a of the enclosure portion 42, and that the movable plate 44 and the damper 40 including the movable plate 44 is closing the discharge opening 20aa. On the other hand, FIG. 3A and FIG. 3B show that the movable plate 44 is away from the tip periphery 42a of the enclosure portion 42, and that the movable plate 44 and the damper 40 including the movable plate 44 are opening the discharge opening 20aa. When the housing 20 has a higher inner pressure and a higher differential pressure from the box 32, the movable plate 44 and the damper 40 open the discharge opening 20aa more widely. In contrast, when the housing 20 has a lower inner pressure and a lower differential pressure from the box 32, the movable plate 44 and the damper 40 open the discharge opening 20aa more narrowly. When the differential pressure between the housing 20 and the box 32 reaches a predetermined level or less, the movable plate 44 and the damper 40 close the discharge opening 20aa.

As shown in FIG. 2B and FIG. 3B, the tip periphery 42a of the enclosure portion 42 is inclined against the lateral wall 20a by becoming more distant from the lateral wall 20a in the downward direction. Thus, when the housing 20 has an inner pressure that is higher than an inner pressure of the box 32 and when the differential pressure reaches a predetermined level or less, the movable plate 44 and the damper 40 including the movable plate 44 close the discharge opening 20aa. Thus, the damper 40 can reduce a gas consumption in the EFEM 10, and even if the housing 20 has a lower inner pressure, the outside air and the gas of the discharge pipe 60 can be prevented from flowing back to the housing 20 via the discharge opening 20aa.

As shown in FIG. 2B, the damper 40 may include a weight 48 attached detachably at any position. The change in weight and position of the weight 48 to be attached on the movable plate 44 changes a movement amount of the movable plate 44 to the differential pressure between the housing 20 and the box 32 (how much the movable plate 44 separates from the tip periphery 42a of the enclosure portion 42). Thus, the weight 44 functions as an adjustment mechanism for changing a correlation between a discharge amount of gas and a differential pressure between the housing 20 and the box 32.

Incidentally, the movable member owned by the damper 40 is not limited to the movable plate 44 shown in FIG. 2B and FIG. 3B and may be another movable member that is movable in response to a differential pressure between the housing 20 and the box 32 and changes a channel resistance between the discharge opening 20aa and the damper 40. The adjustment mechanism is not limited to the weight 48 either and may be another mechanism, such as an energization member capable of changing a movement amount of the movable plate 44 to the differential pressure and a variable gear that changes a rotation resistance of the movable plate 44 to the shaft 46.

The EFEM 10 shown in FIG. 1 is used while a circulating gas flow as shown by the arrows is being formed in the housing 20. The gas flow is produced in such a manner that a gas introduced from the introduction port 16 into the housing 20 circulates between the wafer transportation chamber 22 and the circulation channel 24 using the fan filter unit 11.

The introduction port 16 is controlled by a controller (not illustrated) and introduces a gas into the EFEM 10. For example, when the wafer transportation chamber 22 is desired to have an increased cleanliness, the introduction port 16 can be controlled to start introducing a gas into the housing 20 or to increase an introduction amount of gas into the housing 20 per unit time. At this time, a positive pressure is preferably maintained in the housing 20 filled with the gas for prevention of decrease in cleanliness of the wafer transportation chamber 22 caused by inflow of outside air into the wafer transportation chamber 22.

When the housing 20 has a pressure that is lower than a predetermined value, the damper 40 closes the discharge opening 20aa as shown in FIG. 2A and FIG. 2b, and the discharge port 30 thereby reduces a gas consumption in the EFEM 10 while preventing a pressure decrease of the housing 20 and favorably maintaining the cleanliness of the wafer transportation chamber 22. When a pressure of the housing 20 reaches a predetermined value or higher by introduction of gas from the introduction port 16, the damper 40 opens the discharge opening 20aa as shown in FIG. 3A and FIG. 3B, and the discharge port 30 thereby promotes a gas replacement of the housing 20 while preventing an excessive increase in pressure of the housing 20.

Here, a negative pressure of the discharge pipe 60 connected to the box 32 shown in FIG. 1 may change by operation state of other equipment of the factory shown in FIG. 5. If a pressure of the box 32 decreases more than expected, there is a concern that a discharge amount of gas discharged from the discharge opening 20a a increases, and that a gas consumption in the EFEM 10 increases. Since the box 32 is provided with the clearances 34 (outside-air introduction openings) as shown in FIG. 2A, however, it is possible to prevent changes in pressure of the box 32 resulting from changes in pressure of the discharge pipe 60 and to prevent the gas consumption from increasing.

Due to the outside air introduced from the clearances 34, airflows going from the clearances 34 toward the discharge pipe 60 are formed around the discharge opening 20a a and the enclosure portion 42. Thus, the gas discharged from the discharge opening 20a a by the movement of the movable plate 44 as shown in FIG. 3A follows the airflows going toward the discharge pipe 60 and appropriately flows toward the discharge pipe 60. Thus, the EFEM 10 including the discharge port 30 can prevent a problem of gas leakage to the outside except for the discharge pipe 60.

When the EFEM 10 is installed, when a negative pressure of the discharge pipe 60 regularly changes by change of equipment of the factory, and the like, the discharge port 30 can be operated with appropriate conditions by changing an attachment position and a weight of the weight 48 (adjustment member) to be attached on the movable plate 44.

Figure 2:
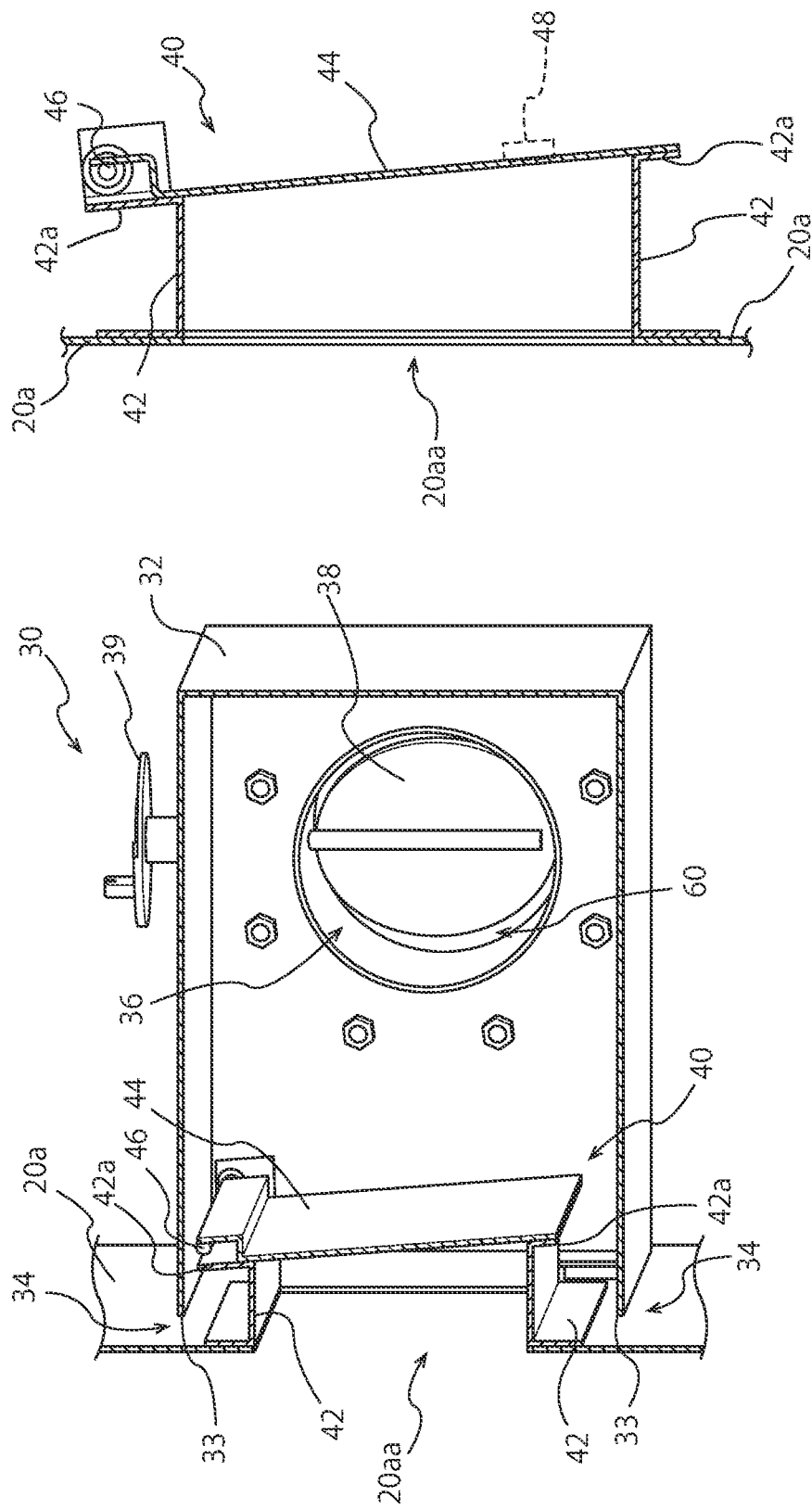
FIG. 2A and FIG. 2B are a schematic cross-sectional view illustrating a closed state of a discharge port and a damper contained in the discharge port in the EFEM shown in FIG. 1.
Figure 3:
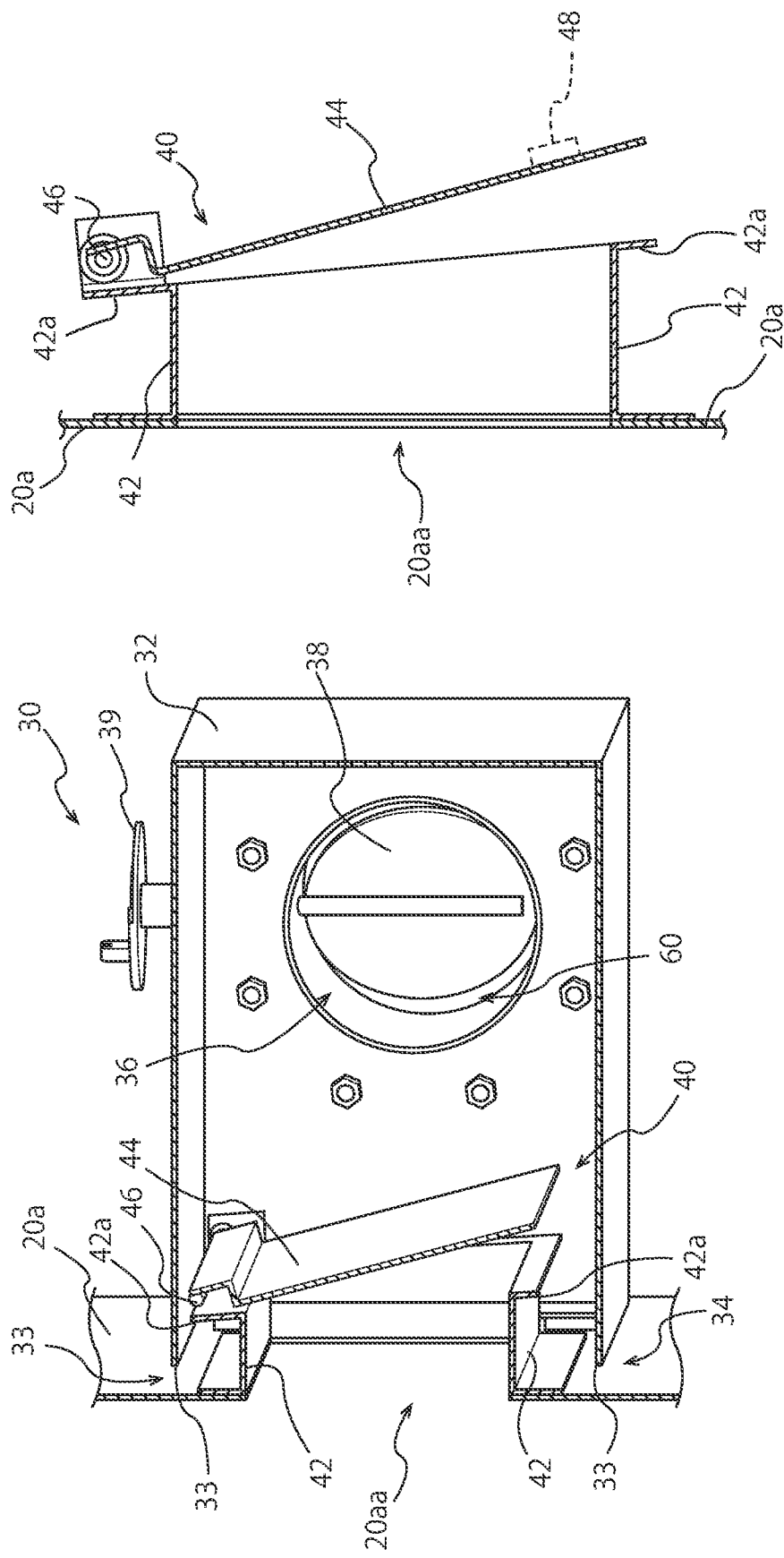
FIG. 3A and FIG. 3B are a schematic cross-sectional view illustrating an open state of a discharge port and a damper contained in the discharge port in the EFEM shown in FIG. 1.

The EFEM 10 shown in FIG. 1 includes the discharge port 30, which opens and closes the discharge opening 20aa with appropriate conditions, and can reduce a gas consumption while maintaining appropriate pressure and cleanliness of the wafer transportation chamber 22. As shown in FIG. 2 and FIG. 3, the discharge port 30 includes the movable plate 44, which moves by the differential pressure itself and adjusts the discharge amount, and has a simple structure. Thus, the discharge port 30 is reliable and excellent in maintenance property.

Hereinbefore, the present invention is described in detail with an embodiment, but needless to say, the present invention is not limited to the above-mentioned embodiment and includes many other embodiments and variations. For example, outside-air introduction openings for introducing an outside air into the box 32 are not limited to the clearances 34 shown in FIG. 2A and FIG. 3A and may be through holes formed in the box 32. The box 32 is not necessarily provided with the outside-air introduction openings. The damper 40 itself has an effect of preventing a variation of a discharge amount of gas discharged from the discharge opening 20a a resulting from a pressure change of the discharge pipe 60.

The discharge opening 20aa is formed on the outer lateral surface of the lateral wall 20a located on the other side of the load port apparatus 70 across the housing 20, but the discharge opening 20aa may be formed on any other place. For example, a discharge opening where the damper 40 is formed may be formed on the wall of the wafer transportation chamber 22 or may be formed on the bottom of the housing 20. When the discharge opening 20aa is formed below a lowest transportation position of the arm 26a of the wafer transportation robot 26, hazardous substances, such as outgas, from the wafers 82 during transportation can efficiently be discharged from the housing 20.

DESCRIPTION OF THE REFERENCE NUMERICAL

- 10 . . . EFEM
- 11 . . . fan filter unit
- 12 . . . fan
- 14 . . . filter
- 16 . . . introduction port
- 20 . . . housing
- 20a . . . lateral wall
- 20aa . . . discharge opening
- 20b . . . ceiling
- 20d . . . intermediate wall
- 22 . . . wafer transportation chamber
- 24 . . . circulation channel
- 26 . . . wafer transportation robot
- 26a . . . arm
- 30 . . . discharge port
- 32 . . . box
- 33 . . . opening periphery
- 34 . . . clearance
- 36 . . . box opening
- 38 . . . connection valve
- 39 . . . valve operation handle
- 40 . . . damper
- 42 . . . enclosure portion
- 42a . . . tip periphery
- 44 . . . movable plate
- 46 . . . shaft
- 48 . . . weight
- 60 . . . discharge pipe
- 70 . . . load port apparatus
- 72 . . . installation stand
- 80 . . . FOUP
- 82 . . . wafer

What is claimed is:

1. A circulating EFEM comprising:
an introduction port for introducing a gas;
a housing for circulating the introduced gas; and
a discharge port for discharging the gas from the housing into a discharge pipe, wherein:
the discharge port includes:
a box disposed to surround a discharge opening formed on the housing and connected to the discharge pipe; and
a damper inside the box to close and open the discharge port and configured to adjust a discharge amount of the gas via the discharge opening by at least partially moving in response to a differential pressure between the housing and the box; and
the damper includes:
a bottomless cylindrical enclosure portion substantially perpendicularly protruding from a lateral wall of the housing with the discharge opening and enclosing an outer circumference of the discharge opening; and
a movable plate configured to close and open the discharge opening enclosed by the enclosure portion by moving so as to contact with and separating from a tip periphery of the enclosure portion.

2. The circulating EFEM according to claim 1, wherein the damper includes an adjustment mechanism for changing a correlation between a discharge amount of the gas and the differential pressure.

3. The circulating EFEM according to claim 1, wherein the box is provided with an outside-air introduction opening for introducing an outside air of the housing into the box.

4. The circulating EFEM according to claim 3, wherein the outside-air introduction opening is a clearance formed between the box and a lateral wall of the housing with the discharge opening.

5. The circulating EFEM according to claim 1, wherein
the damper includes a shaft disposed in substantially parallel to the lateral wall of the housing above the enclosure portion, and
the movable plate rotates around the shaft.

6. The circulating EFEM according to claim 1, wherein the tip periphery of the enclosure portion is inclined against the lateral wall of the housing.

7. The circulating EFEM according to claim 1, wherein the discharge opening is formed below the introduction port of the housing.

8. A circulating EFEM comprising:
a housing for circulating a gas;
an introduction port for introducing the gas into the housing; and
a discharge port for discharging the gas from the housing into a discharge pipe, wherein:
the discharge port includes:
a box disposed to surround a discharge opening of the housing and connected to the discharge pipe; and
a damper inside the box to close and open the discharge port and configured to adjust a discharge amount of the gas via the discharge opening by at least partially moving in response to a differential pressure between the housing and the box;
the damper includes:
a bottomless cylindrical enclosure portion substantially perpendicularly protruding from a lateral wall of the housing with the discharge opening and enclosing an outer circumference of the discharge opening;
a movable plate configured to close and open the discharge opening enclosed by the enclosure portion by moving so as to contact with and separating from a tip periphery of the enclosure portion; and
an adjustment mechanism for changing a correlation between a discharge amount of the gas and the differential pressure; and
the adjustment mechanism is a load member adjusting the movable amount of the damper in response to the differential pressure by varying a load to the damper.

9. The circulating EFEM according to claim 8, wherein the load member is a weight whose position is adjustable in the damper.

* * * * *